(12) United States Patent
Takeuchi

(10) Patent No.: US 10,381,242 B2
(45) Date of Patent: Aug. 13, 2019

(54) METHOD FOR MAKING A SEMICONDUCTOR DEVICE INCLUDING A SUPERLATTICE AS A GETTERING LAYER

(71) Applicant: Atomera Incorporated, Los Gatos, CA (US)

(72) Inventor: Hideki Takeuchi, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 3 days.

(21) Appl. No.: 15/980,902

(22) Filed: May 16, 2018

(65) Prior Publication Data

US 2018/0337064 A1    Nov. 22, 2018

Related U.S. Application Data

(60) Provisional application No. 62/506,875, filed on May 16, 2017.

(51) Int. Cl.
*H01L 21/322* (2006.01)
*H01L 21/02* (2006.01)
(Continued)

(52) U.S. Cl.
CPC .... *H01L 21/3225* (2013.01); *H01L 21/02381* (2013.01); *H01L 21/02507* (2013.01);
(Continued)

(58) Field of Classification Search
CPC ... H01L 29/151; H01L 29/15; H01L 21/3225; H01L 21/02507; H01L 21/7698; H01L 21/3221
See application file for complete search history.

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| EP | 0 843 361 | 5/1998 |
| GB | 2347520 | 6/2000 |

(Continued)

OTHER PUBLICATIONS

Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs.

(Continued)

*Primary Examiner* — Grant S Withers
(74) *Attorney, Agent, or Firm* — Allen, Dyer, Doppelt + Gilchrist, P.A.

(57) ABSTRACT

A semiconductor processing method may include forming a superlattice gettering layer on a front side of a semiconductor substrate having a first thickness, epitaxially growing an active semiconductor layer on the superlattice gettering layer opposite the semiconductor substrate, forming at least one semiconductor device in the active semiconductor layer, and forming at least one metal interconnect layer on the active layer, and at least one metal through-via extending from the at least one metal interconnect layer into the semiconductor substrate. The method may further include thinning the semiconductor substrate from a back side thereof to a second thickness less than the first thickness, and thinning the semiconductor substrate. The superlattice gettering layer getters metal ions released by the forming of the at least one metal interconnect layer and at least one metal through-via, and thinning the substrate.

20 Claims, 14 Drawing Sheets

(51) Int. Cl.
*H01L 23/522* (2006.01)
*H01L 21/768* (2006.01)
*H01L 23/48* (2006.01)
*H01L 29/15* (2006.01)

(52) U.S. Cl.
CPC .... *H01L 21/3221* (2013.01); *H01L 21/76898* (2013.01); *H01L 23/481* (2013.01); *H01L 23/5226* (2013.01); *H01L 29/151* (2013.01); *H01L 2224/14181* (2013.01); *H01L 2224/16145* (2013.01); *H01L 2224/16225* (2013.01); *H01L 2924/15311* (2013.01)

(56) References Cited

U.S. PATENT DOCUMENTS

| | | | |
|---|---|---|---|
| 5,357,119 | A | 10/1994 | Wang et al. |
| 5,683,934 | A | 11/1997 | Candelaria |
| 5,796,119 | A | 8/1998 | Seabaugh |
| 5,951,755 | A | 9/1999 | Miyashita et al. |
| 6,141,361 | A | 10/2000 | Mears et al. |
| 6,376,337 | B1 | 4/2002 | Wang et al. |
| 6,472,685 | B2 | 10/2002 | Takagi |
| 6,734,453 | B2 | 5/2004 | Atanackovic et al. |
| 6,741,624 | B2 | 5/2004 | Mears et al. |
| 6,830,964 | B1 | 12/2004 | Mears et al. |
| 6,833,294 | B1 | 12/2004 | Mears et al. |
| 6,878,576 | B1 | 4/2005 | Mears et al. |
| 6,891,188 | B2 | 5/2005 | Mears et al. |
| 6,897,472 | B2 | 5/2005 | Mears et al. |
| 6,927,413 | B2 | 8/2005 | Mears et al. |
| 6,952,018 | B2 | 10/2005 | Mears et al. |
| 6,958,486 | B2 | 10/2005 | Mears et al. |
| 6,993,222 | B2 | 1/2006 | Mears et al. |
| 7,018,900 | B2 | 3/2006 | Kreps |
| 7,033,437 | B2 | 4/2006 | Mears et al. |
| 7,034,329 | B2 | 4/2006 | Mears et al. |
| 7,045,377 | B2 | 5/2006 | Mears et al. |
| 7,045,813 | B2 | 5/2006 | Mears et al. |
| 7,071,119 | B2 | 7/2006 | Mears et al. |
| 7,105,895 | B2 | 9/2006 | Wang et al. |
| 7,109,052 | B2 | 9/2006 | Mears et al. |
| 7,123,792 | B1 | 10/2006 | Mears et al. |
| 7,148,712 | B1 | 12/2006 | Prey, Jr. et al. |
| 7,153,763 | B2 | 12/2006 | Hytha et al. |
| 7,202,494 | B2 | 4/2007 | Blanchard et al. |
| 7,227,174 | B2 | 6/2007 | Mears et al. |
| 7,229,902 | B2 | 6/2007 | Mears et al. |
| 7,265,002 | B2 | 9/2007 | Mears et al. |
| 7,279,699 | B2 | 10/2007 | Mears et al. |
| 7,279,701 | B2 | 10/2007 | Kreps |
| 7,288,457 | B2 | 10/2007 | Kreps |
| 7,303,948 | B2 | 12/2007 | Mears et al. |
| 7,432,524 | B2 | 10/2008 | Mears et al. |
| 7,435,988 | B2 | 10/2008 | Mears et al. |
| 7,436,026 | B2 | 10/2008 | Kreps |
| 7,446,002 | B2 | 11/2008 | Mears et al. |
| 7,446,334 | B2 | 11/2008 | Mears et al. |
| 7,491,587 | B2 | 2/2009 | Rao |
| 7,514,328 | B2 | 4/2009 | Rao |
| 7,517,702 | B2 | 4/2009 | Halilov et al. |
| 7,531,828 | B2 | 5/2009 | Mears et al. |
| 7,531,829 | B2 | 5/2009 | Blanchard |
| 7,531,850 | B2 | 5/2009 | Blanchard |
| 7,586,116 | B2 | 9/2009 | Kreps et al. |
| 7,586,165 | B2 | 9/2009 | Blanchard |
| 7,598,515 | B2 | 10/2009 | Mears et al. |
| 7,612,366 | B2 | 11/2009 | Mears et al. |
| 7,625,767 | B2 | 12/2009 | Huang et al. |
| 7,659,539 | B2 | 2/2010 | Kreps et al. |
| 7,700,447 | B2 | 4/2010 | Dukovski et al. |
| 7,718,996 | B2 | 5/2010 | Dukovski et al. |
| 7,781,827 | B2 | 8/2010 | Rao |
| 7,812,339 | B2 | 10/2010 | Mears et al. |
| 7,863,066 | B2 | 1/2011 | Mears et al. |
| 7,880,161 | B2 | 2/2011 | Mears et al. |
| 7,928,425 | B2 | 4/2011 | Rao |
| 8,389,974 | B2 | 3/2013 | Mears et al. |
| 9,275,996 | B2 | 3/2016 | Mears et al. |
| 9,406,753 | B2 | 8/2016 | Mears et al. |
| 9,455,185 | B1 | 9/2016 | Gluschenkov et al. |
| 9,558,939 | B1 | 1/2017 | Stephenson et al. |
| 9,899,479 | B2 | 2/2018 | Mears et al. |
| 2003/0034529 | A1 | 2/2003 | Fitzgerald et al. |
| 2003/0057416 | A1 | 3/2003 | Currie et al. |
| 2006/0220118 | A1 | 10/2006 | Stephenson et al. |
| 2007/0012910 | A1 | 1/2007 | Mears et al. |
| 2007/0020833 | A1 | 1/2007 | Mears et al. |
| 2008/0012004 | A1 | 1/2008 | Huang et al. |
| 2008/0258134 | A1 | 10/2008 | Mears et al. |
| 2011/0215299 | A1 | 9/2011 | Rao |
| 2014/0319698 | A1 | 10/2014 | Molin et al. |
| 2015/0206936 | A1 | 7/2015 | Huang |
| 2015/0357414 | A1 | 12/2015 | Mears |
| 2016/0099317 | A1 | 4/2016 | Mears et al. |
| 2016/0149023 | A1 | 5/2016 | Mears et al. |
| 2016/0336406 | A1 | 11/2016 | Mears et al. |
| 2016/0358773 | A1 | 12/2016 | Mears et al. |
| 2017/0294514 | A1 | 10/2017 | Mears |
| 2017/0301757 | A1 | 10/2017 | Mears et al. |
| 2017/0330609 | A1 | 11/2017 | Roy |
| 2018/0040714 | A1 | 2/2018 | Mears et al. |
| 2018/0040724 | A1* | 2/2018 | Mears .................. H01L 29/882 |
| 2018/0040725 | A1 | 2/2018 | Mears et al. |
| 2018/0040743 | A1 | 2/2018 | Mears et al. |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 96/29728 | 9/1996 |
| WO | 99/63580 | 12/1999 |
| WO | 02/103767 | 12/2002 |
| WO | 2005034325 | 4/2005 |
| WO | 2007011790 | 1/2007 |
| WO | 2007130973 | 11/2007 |
| WO | 2008130899 | 10/2008 |

OTHER PUBLICATIONS

Bu, "FINFET Technology, a substrate prospective", IBM Research, PreT0 Alliance, SOI Conference, 2011, pp. 1-28.

Shinada et al., Nature 437, 1128 (2005)) Retrieved from internet Jun. 19, 2015; 3 pgs.

Liu et al. "Threshold voltage model for deep-submicrometer MOSFET's" IEEE Transactions on Electron Devices; vol. 40, No. 1; Jan. 1993; pp. 86-95.

Brews et al. "Generalized guide for MOSFET miniaturization" IEE Electron Device Letters. vol. EDL-1; Jan. 1980; pp. 2-4.

Damrongplasit et al. Comparative study of uniform versus supersteep retrograde MOSFET channel doping and implications for 6-T SRAM yield: IEEE Transactions on Electron Devices; vol. 60, No. 5; May 2013; pp. 1790-1793.

Ye et al., GaAs MOSFET with Oxide Gate Dielectric Grown by Atomic Layer Deposition, Agere Systems, Mar. 2003; 7 pgs.

Novikov et al., Silicon-based Optoelectronics, 1999-2003, pp. 1-6.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000; 4 pgs.

Shah et al., Experimental Analysis and Theoretical Model for Anomalously High Ideality Factors (n>2.0) in AlGaN/GaN P-N Junction Diodes, Journal of Applied Physics, vol. 94, No. 4, Aug. 15, 2003; 4 pgs.

Ball, Striped Nanowires Shrink Electronics, news@nature.com, Feb. 7, 2002; 2 pgs.

Fiory et al., Light Emission from Silicon: Some Perspectives and Applications, Journal of Electronic Materials, vol. 32, No. 10, 2003; pp. 1043-1051.

(56) References Cited

OTHER PUBLICATIONS

Lecture 6: Light Emitting and Detecting Devices, MSE 6001, Semiconductor Materials Lectures, Fall 2004; 4 pgs.
U.S. Appl. No. 15/664,028, filed Jul. 31, 2017 Mears et al.
U.S. Appl. No. 15/678,616, filed Aug. 16, 2017 Richard Stephen Roy.
U.S. Appl. No. 15/678,658, filed Aug. 16, 2017 Richard Stephen Roy.
U.S. Appl. No. 15/842,981, filed Dec. 15, 2017 Chen et al.
U.S. Appl. No. 15/842,989, filed Dec. 15, 2017 Mears et al.
U.S. Appl. No. 15/842,990, filed Dec. 15, 2017 Chen et al.
U.S. Appl. No. 15/842,993, filed Dec. 15, 2017 Chen et al.
U.S. Appl. No. 15/843,013, filed Dec. 15, 2017 Mears et al.
U.S. Appl. No. 15/843,017, filed Dec. 15, 2017 Chen et al.
U.S. Appl. No. 15/843,044, filed Dec. 15, 2017 Chen et al.
U.S. Appl. No. 15/843,077, filed Dec. 15, 2017 Chen et al.
U.S. Appl. No. 15/843,106, filed Dec. 15, 2017 Chen et al.
U.S. Appl. No. 15/843,113, filed Dec. 15, 2017 Chen et al.
U.S. Appl. No. 15/843,121, filed Dec. 15, 2017 Chen et al.
U.S. Appl. No. 15/843,136, filed Dec. 15, 2017 Chen et al.
U.S. Appl. No. 15/916,766, filed Mar. 9, 2018 Weeks et al.
U.S. Appl. No. 15/916,831, filed Mar. 9, 2018 Weeks et al.
U.S. Appl. No. 15/980,893, filed May 16, 2018 Hideki Takeuchi.
U.S. Appl. No. 16/007,186, filed Jun. 13, 2018 Kalipatnam Vivek Rao.
U.S. Appl. No. 16/007,209, filed Jun. 13, 2018 Kalipatnam Vivek Rao.
John H. Lou "Supply chains for high-volume manufacturing of 3D IC integration" hppt://www.chipscalerreview.com/legacy/tech_mnthly/csrtm-1112-supply-chains.php.htm Jul.-Aug. 2014; pp. 7.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
R. Tsu Phenomena in silicon nanostructure device published online Sep. 6, 2000 by Applied Physics and Materials Science & Processing, pp. 391-402.
Raphael Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.

\* cited by examiner

METHOD FOR MAKING A SEMICONDUCTOR DEVICE INCLUDING A SUPERLATTICE AS A GETTERING LAYER

CROSS-REFERENCE TO RELATED APPLICATIONS

This application claims the benefit of U.S. provisional application Ser. No. 62/506,875 filed May 16, 2017, which is hereby incorporated herein in its entirety by reference.

TECHNICAL FIELD

The present disclosure generally relates to semiconductor devices and, more particularly, to semiconductor wafer processing and device fabrication.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

SUMMARY

A semiconductor processing method may include forming a superlattice gettering layer on a front side of a semiconductor substrate having a first thickness. The superlattice gettering layer may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The method may further include epitaxially growing an active semiconductor layer on the superlattice gettering layer opposite the semiconductor substrate, forming at least one semiconductor device in the active semiconductor layer, and forming at least one metal interconnect layer on the active layer, and at least one metal through-via extending from the at least one metal interconnect layer into the semiconductor substrate. The method may further include thinning the semiconductor substrate from a back side thereof to a second thickness less than the first thickness. Moreover, the superlattice gettering layer getters metal ions released by the forming of the at least one metal interconnect layer and at least one metal through-via, and thinning the semiconductor substrate.

In accordance with one example implementation, the second thickness may be less than 200 μm, and in another implementation, less than 70 μm. Also by way of example, the active semiconductor layer may have a thickness in a range of 2 to 5 μm.

Furthermore, the at least one metal interconnect may comprise copper, for example. Also by way of example, each base semiconductor portion may comprise silicon, and the at least one non-semiconductor layer may comprise oxygen. Epitaxially growing the active semiconductor layer may comprise epitaxially growing a silicon layer. In addition, forming the at least one semiconductor device may include forming at least one field effect transistor (FET) in the active semiconductor layer.

DETAILED DESCRIPTION

Figure 1:
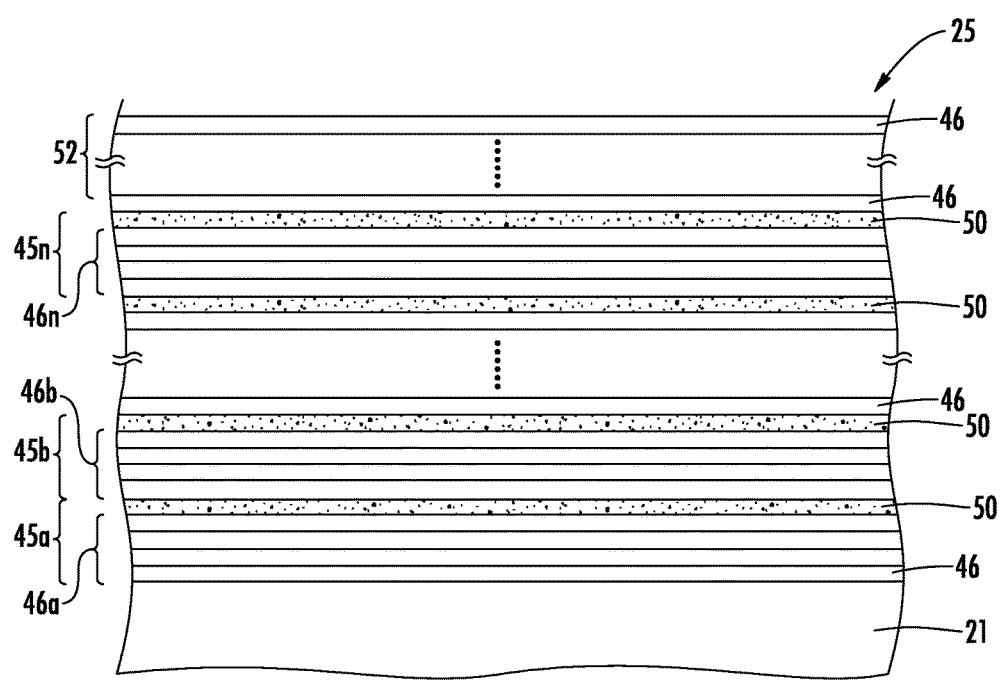
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to semiconductor wafer processing and device fabrication techniques which utilize an enhanced semiconductor superlattice as a gettering layer to prevent metal contamination in the device layer of a chip. The enhanced semiconductor superlattice is also referred to as an "MST" layer or "MST technology" in this disclosure. Further background on the use of MST technology may be found in U.S. Pat. No. 9,275,996 to Mears et al., which is hereby incorporated herein in its entirety by reference.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_f} \int_{B.Z.} (1 - f(E(k,n), E_F, T)) d^3k}$$

for electrons and:

$$M_{h,ij}^{-1}(E_F, T) = -\frac{\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
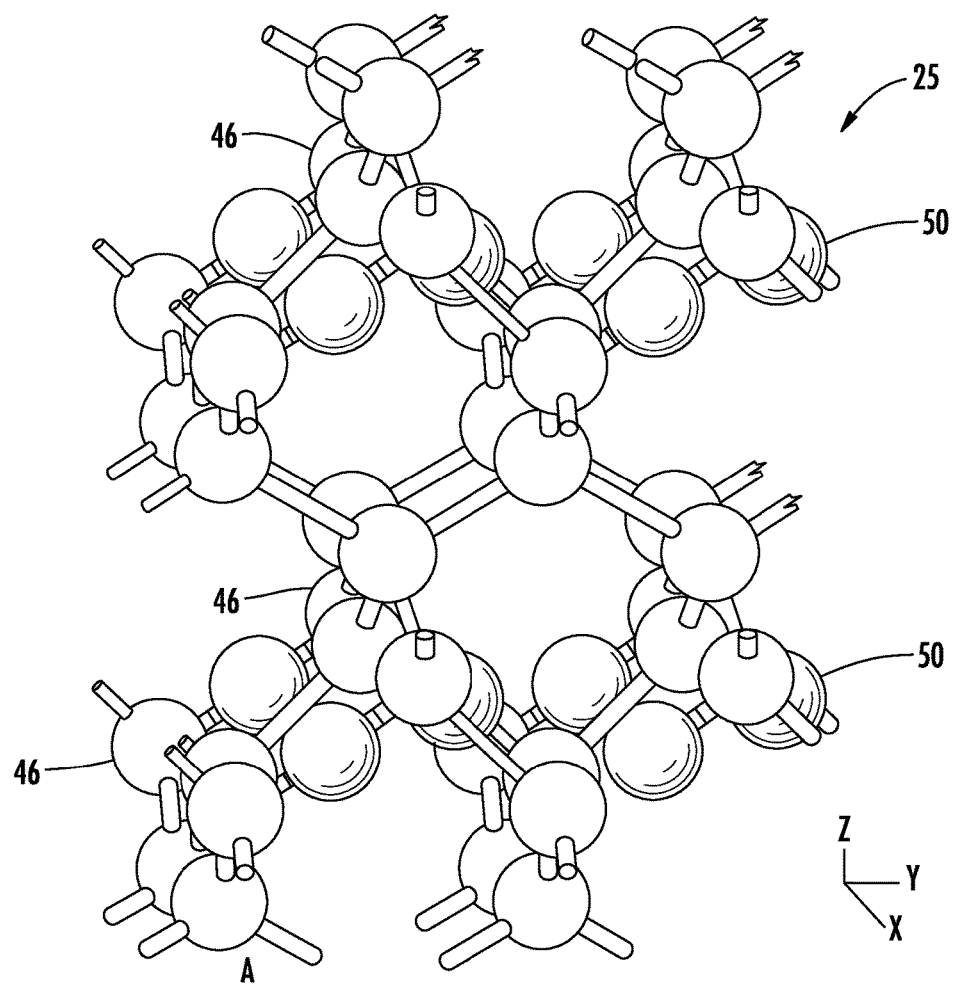
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
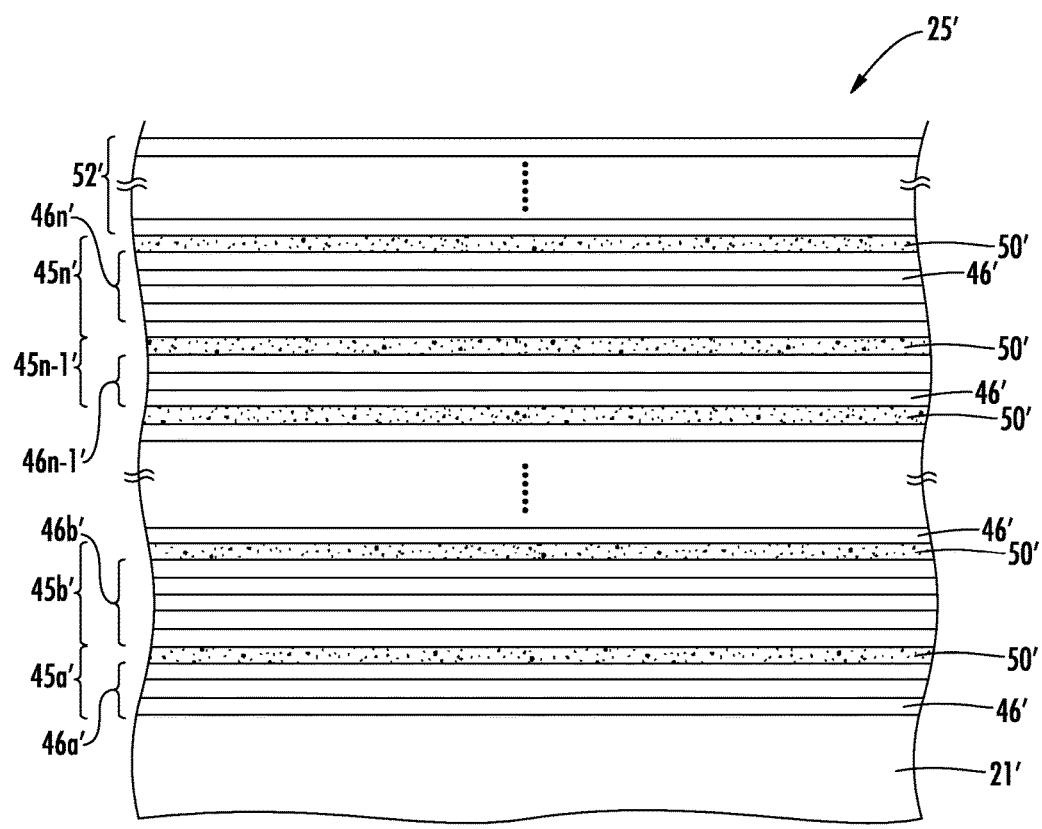
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
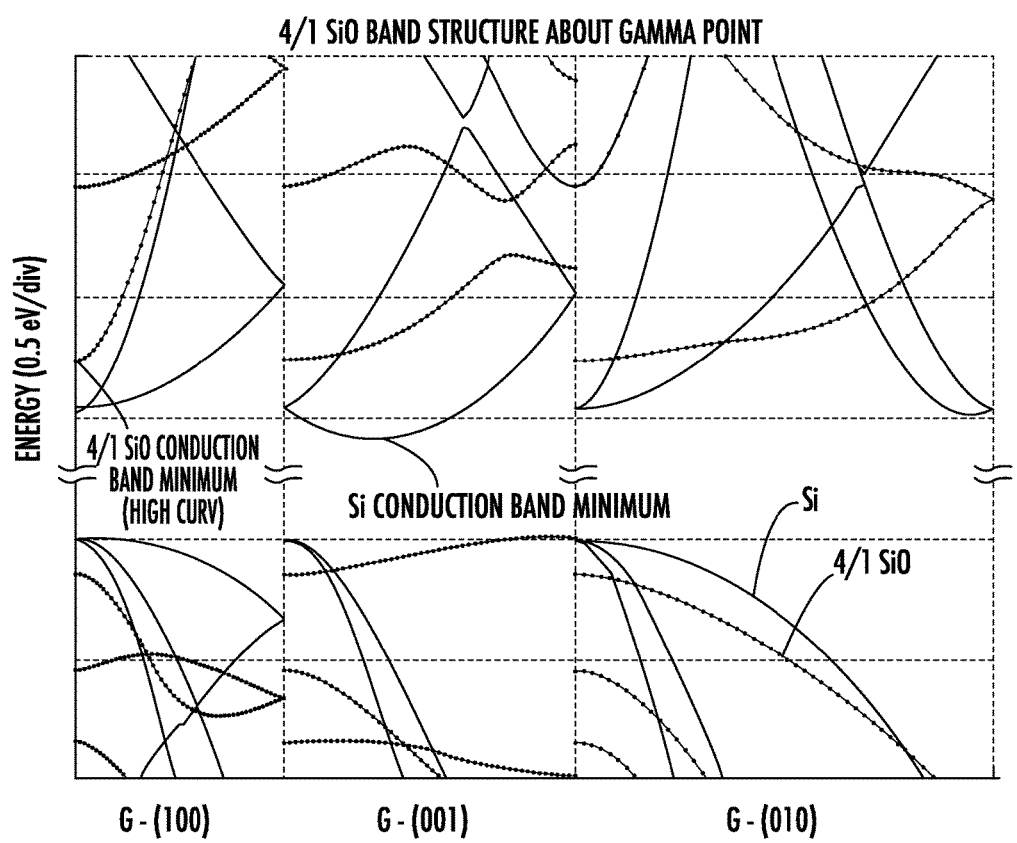
FIG. 4A is a graph of the calculated band structure from the gamma point (G) for both bulk silicon as in the prior art, and for the 4/1 Si/O superlattice as shown in FIGS. 1-2.
Figure 4B:
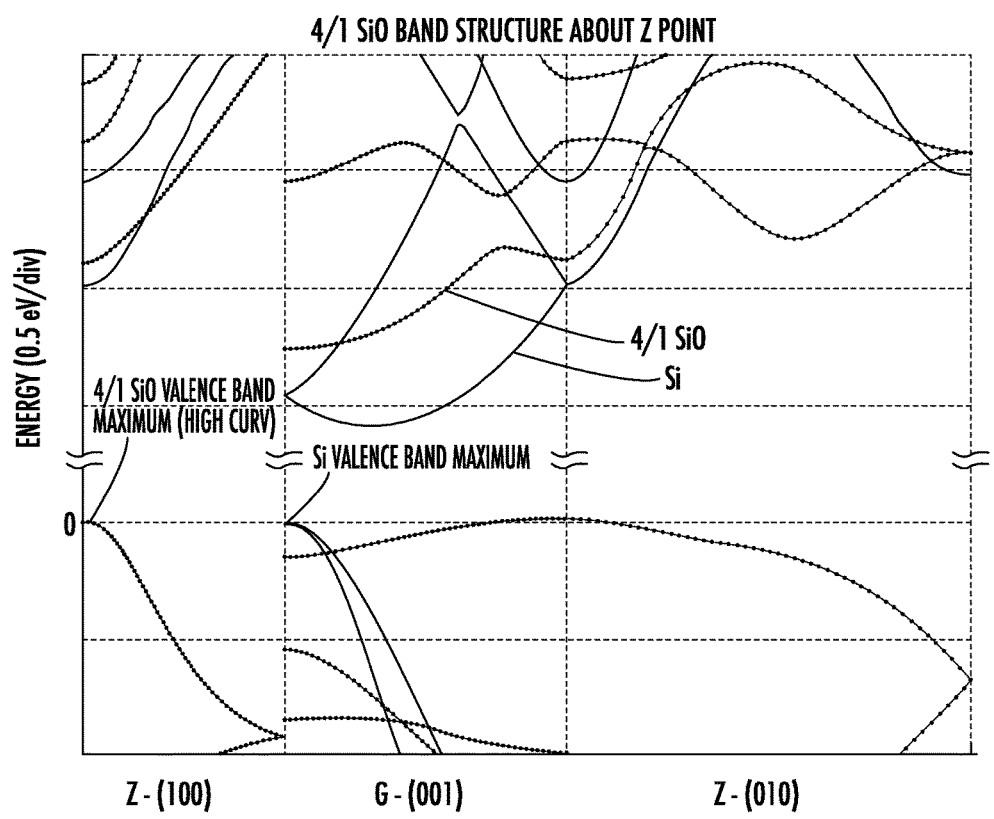
FIG. 4B is a graph of the calculated band structure from the Z point for both bulk silicon as in the prior art, and for the 4/1 Si/O superlattice as shown in FIGS. 1-2.
Figure 4C:
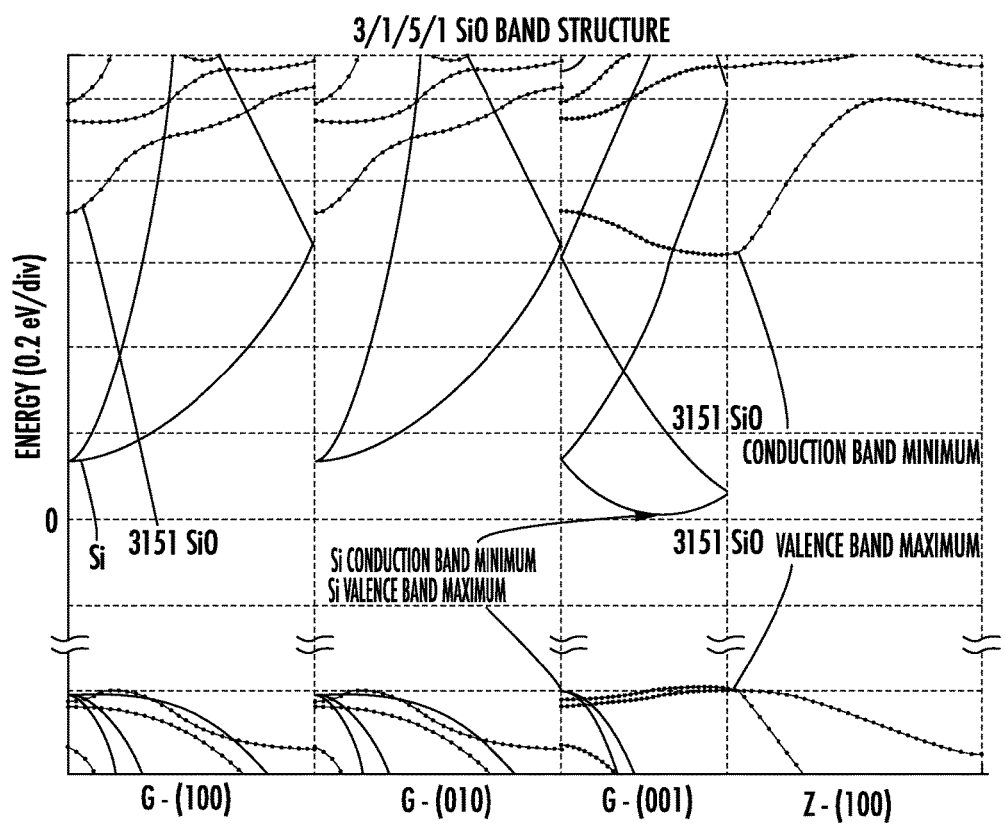
FIG. 4C is a graph of the calculated band structure from both the gamma and Z points for both bulk silicon as in the prior art, and for the 5/1/3/1 Si/O superlattice as shown in FIG. 3.
Figure 5:
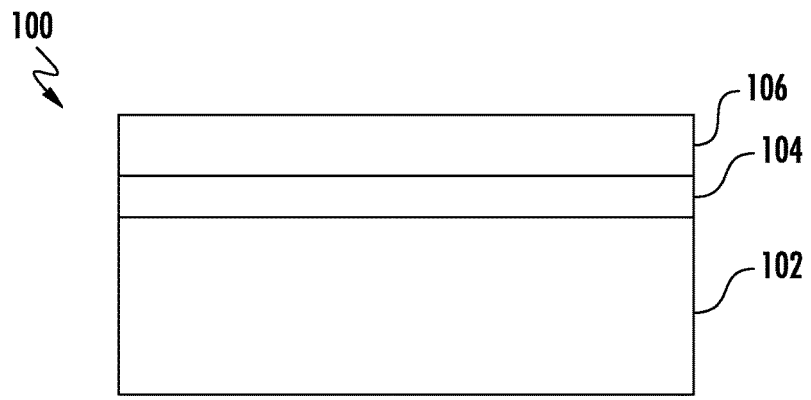
FIGS. 5-19 are a series of schematic cross-sectional views illustrating a method for making a semiconductor device including a superlattice getting layer in accordance with an example embodiment.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Referring now to FIGS. 5-19, in accordance with one advantageous embodiment, the above-described MST superlattice structures (e.g., Si/O structures) may be used as a gettering layer for Si epitaxial wafers. By way of background, stacked chip structures integrating different chip functions (e.g., image sensors, DRAM, Logic, etc.) which are connected using TSV (through silicon vias) in a single package have recently come into favor. For stacked chip structures, each chip is typically ground much thinner (~70 μm) than with silicon wafers used with conventional packaging, which are ~200-800 μm.

A conventional silicon wafer typically has a gettering layer on the wafer back side. During wafer processing, metals, such as Cu used in BEOL diffused into silicon substrates, are trapped in this gettering layer. During the wafer back grinding and CMP process, trapped metals are released into the water or CMP slurry when the gettering layer is ground or polished. While the wafer front side typically has a SiN passivation layer to protect metal diffusions, the wafer back side has no protection after the gettering layer is removed. As a result, with aggressive thinning of stacked chips, yield loss due to metal contamination during the packaging process may be problematic.

In accordance with an example embodiment for an Si/O implementation with Si wafers, an MST superlattice 104 may be formed on the "front" side of a starting wafer or substrate 102 using a blanket deposition. By way of example, the starting substrate 102 may be cut from a CZ (Czochralski process) silicon boule. Then, a ~2 to 5 μm-thick regular epitaxial silicon layer (i.e., a cap layer) 106 is grown on top of the superlattice 104. Notably, the ~2 to 5 μm epitaxial growth is isolated from the underlying starting substrate 102 by the superlattice 104. The overall wafer structure 100 may then be used in downstream or manufacturing processes.

Figure 6:
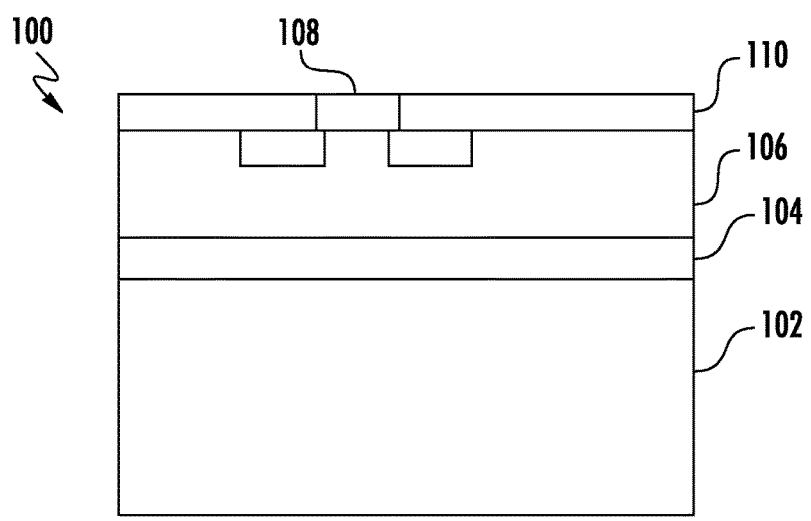
Figure 7:
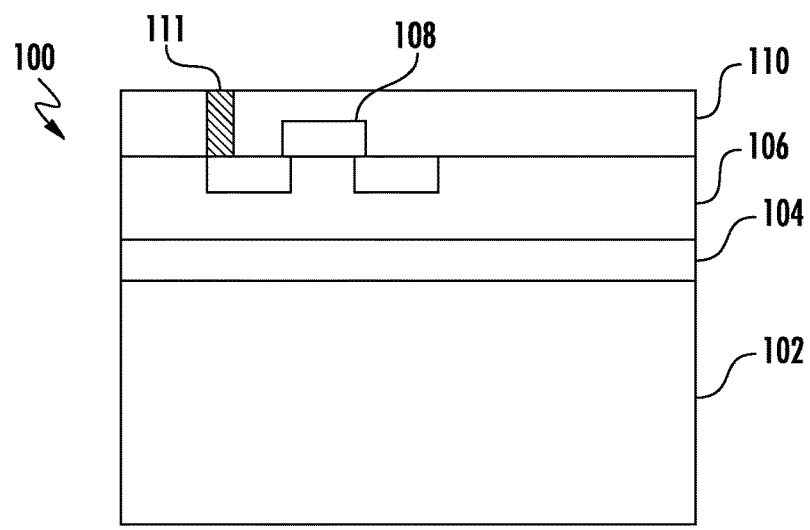
Figure 8:
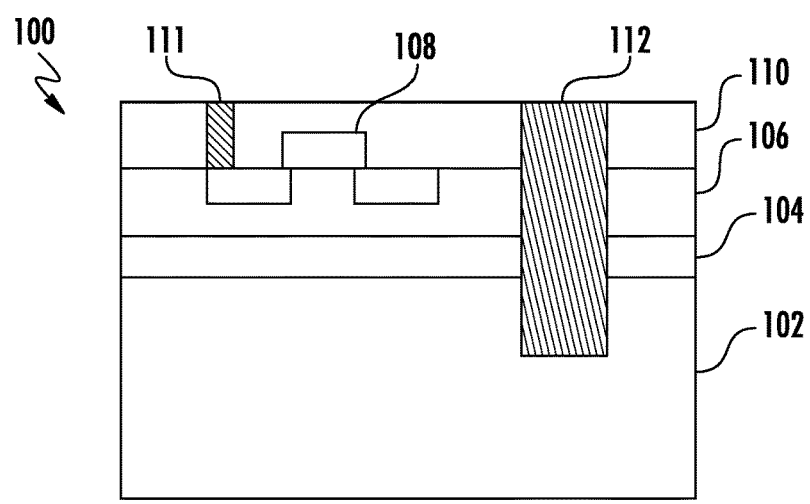

More particularly, one or more circuits 108 may then be formed in the epitaxial semiconductor layer 106 during front end of line (FEOL) processing, such as including field effect transistors (FETs), for example, followed by a nitride layer 110 (FIG. 6). Middle-of-line (MOL) processing is then performed to form a contact 111 (FIG. 7). Next, through silicon via (TSV) formation may be performed (FIG. 8) to form a metal (e.g., copper) via 112 through the epitaxial (active) layer 106 and superlattice getting layer 104 and into the substrate 102.

Figure 9:
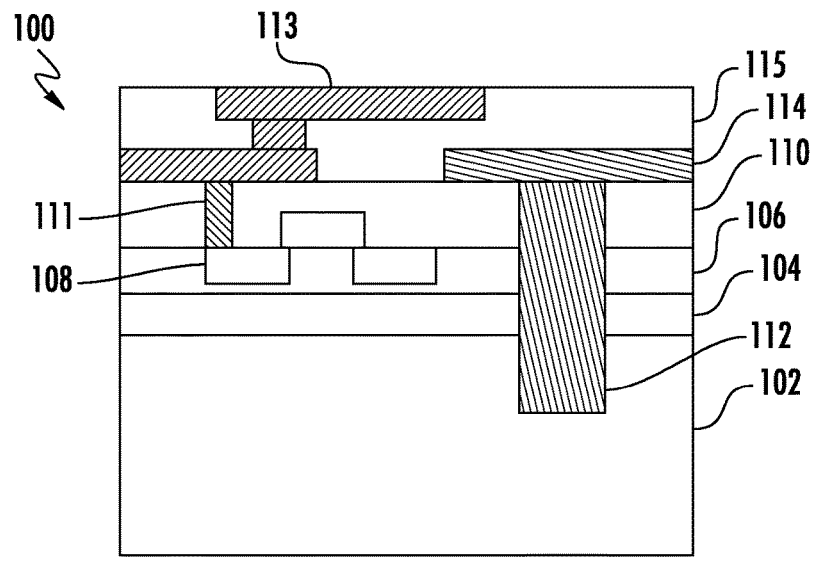
Figure 10:
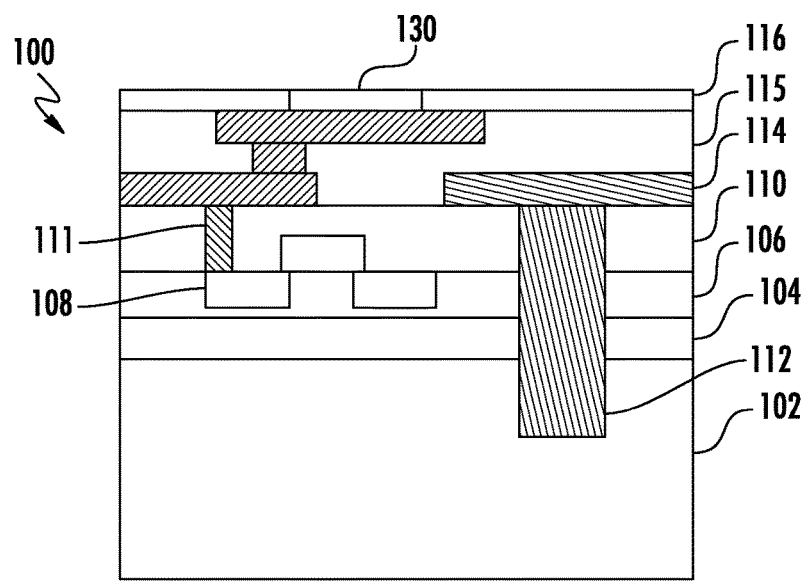

Back-end-of-line (BEOL) processing may then be performed to form metal interconnect layers 113, 114 respectively coupled to the contact 111 and via 112. The interconnect layers 112 are separated by an intervening insulator 115 (e.g., metal oxide) (FIG. 9). A passivation layer 116 (e.g., an oxide) may then be formed with an opening 130 provided to expose the desired interconnect layers (here the metal layer 113) (FIG. 10).

Figure 11:
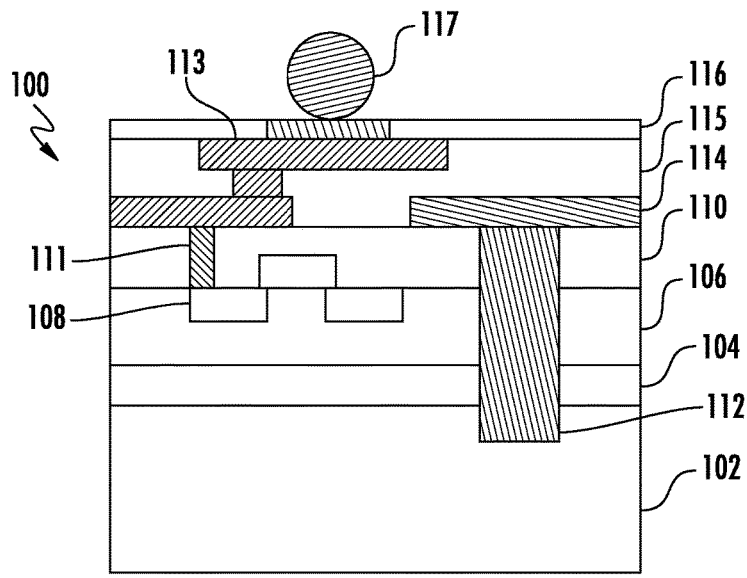
Figure 12:
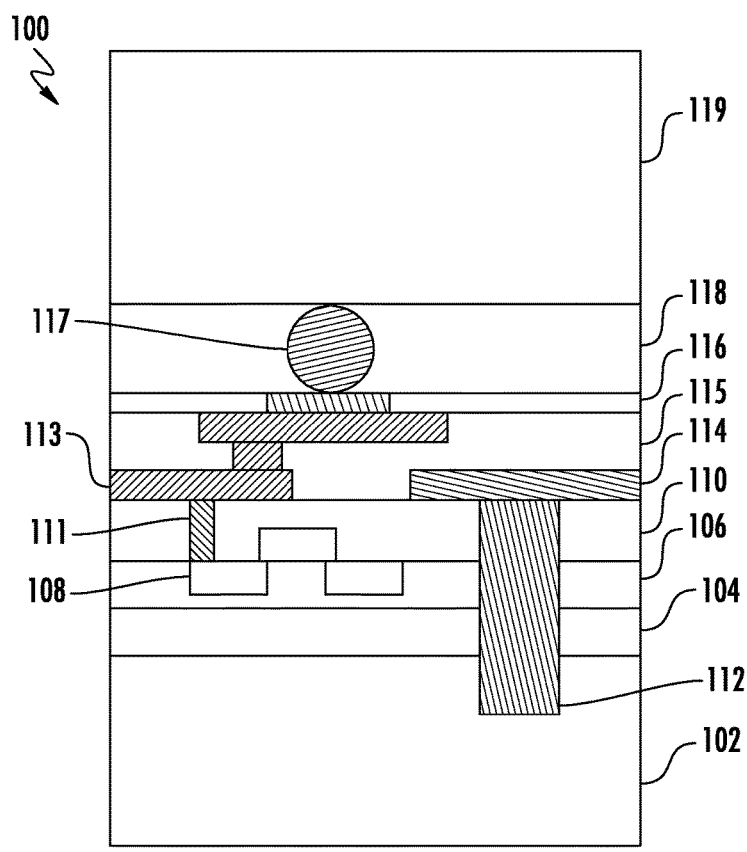
Figure 13:
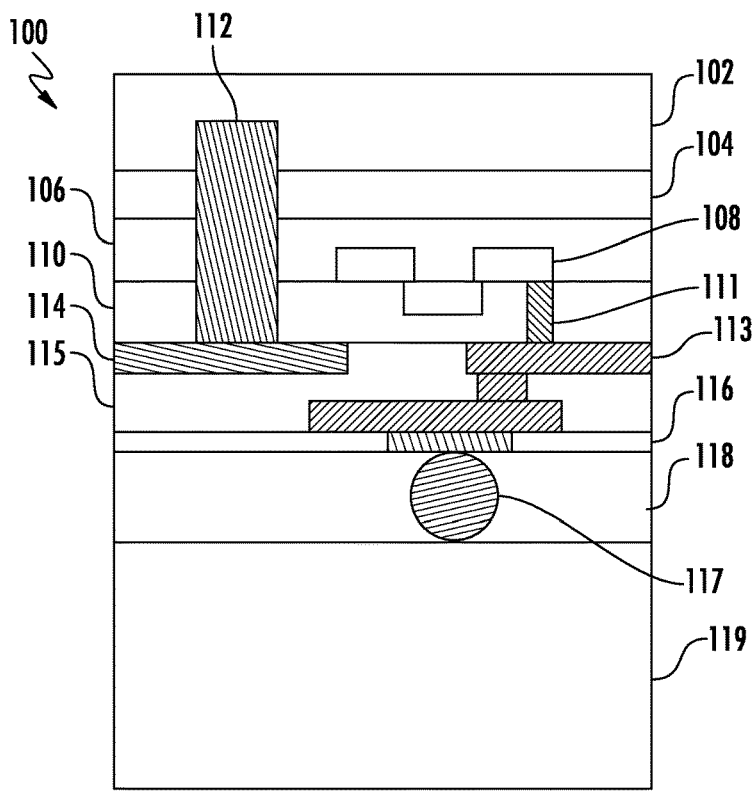

Middle-end-of-line (MEAL) processing may then begin with the formation of a conductive contact "bump" 117, i.e., under bump metallization (UBM) formation, at the location of the opening (FIG. 11). Thereafter, a temporary carrier 119 may be bonded to the TSV structure with an adhesive 118 (FIG. 12). The carrier 119 may then be used to flip the TSV structure so that back grinding may be performed on the substrate 102. (FIG. 13).

More particularly, the back side of the substrate 102 is thinned (e.g., using back grinding and/or dry etching) with the MST gettering superlattice 104 remaining between the thinned bulk silicon and the epitaxial silicon layer 106. Thinning is typically done to within a few microns of the tip of the TSV 112. After thinning down to the desired thickness (e.g., 200 µm or less, and more particularly about 70 µm or less for stacked chip devices), the superlattice non-semiconductor (e.g., oxygen) monolayers trap or getter metals and prevent their diffusion into the circuit device active regions in the epitaxial layer 106 formed on the front side of the superlattice 104, and thereby help retain yield loss at acceptable levels. Applicant theorizes, without wishing to be bound thereto, that the MST superlattice has greater thermal stability than the conventional single oxygen layer, and has a significantly higher number of gettering sites in view of the higher number of oxygen atoms provided in the superlattice. This may be particularly advantageous for applications such as the stacked chip devices described above, yet without the above-described drawbacks associated with conventional gettering layers.

Devices produced in accordance with this approach will typically include metal captured in the bulk silicon 102 adjacent the MST superlattice 104, and the superlattice gettering layer 104 will accordingly include gettered metal ions in the final device as well, as will be appreciated by those skilled in the art. In addition to Si/O superlattices and Si wafers noted above, this approach may be used with other types of semiconductor substrates and superlattices as well, as will be appreciated by those skilled in the art.

Figure 14:
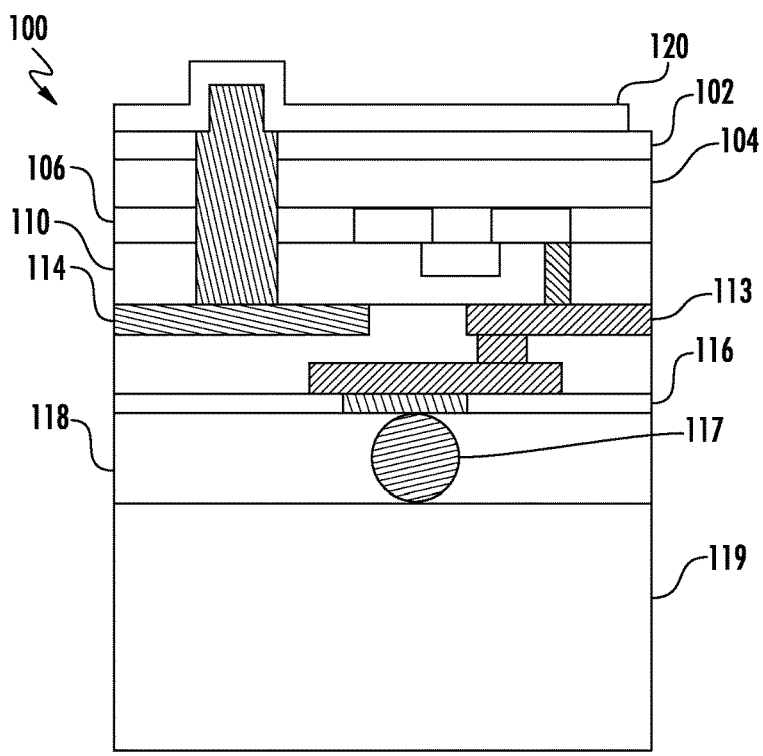
Figure 15:
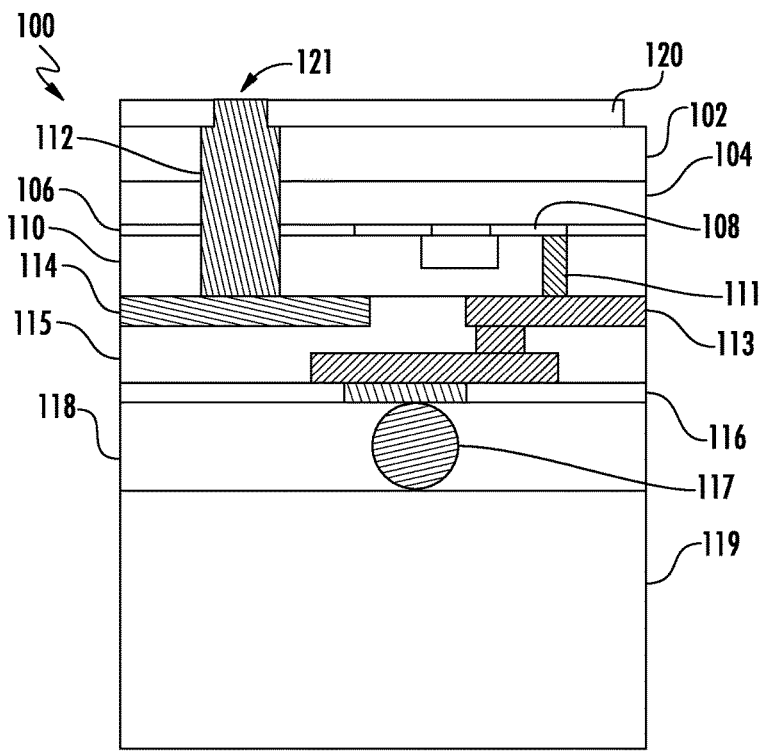
Figure 16:
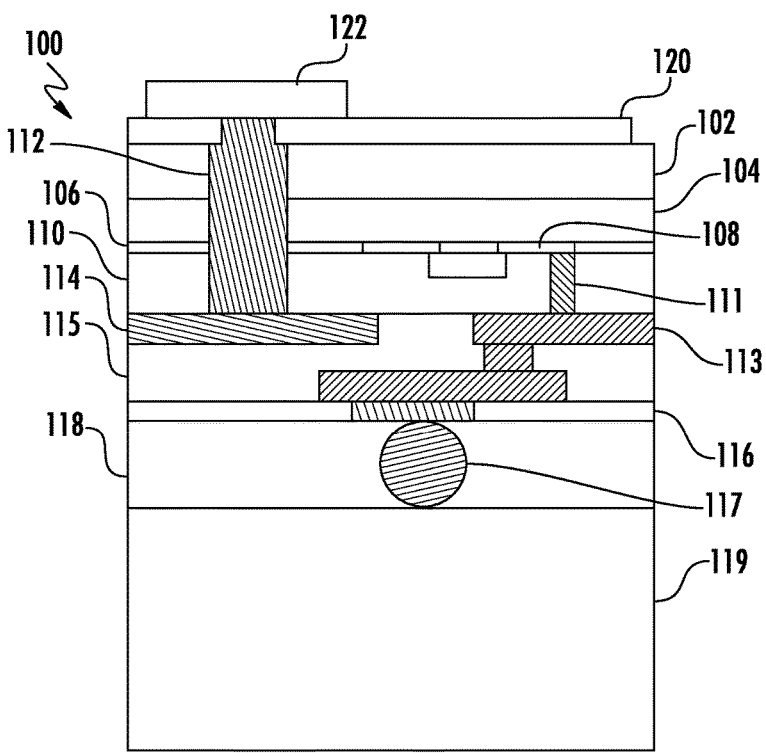

Further processing steps may include etching of the thinned substrate 102 to expose the TSV 112 and form a passivation layer 120 over the TSV and substrate (FIG. 14). An opening 121 may then be formed in the passivation layer 120 to expose the TSV 112 (FIG. 15), followed by the formation of a UBM pad 122 (FIG. 16).

Figure 17:
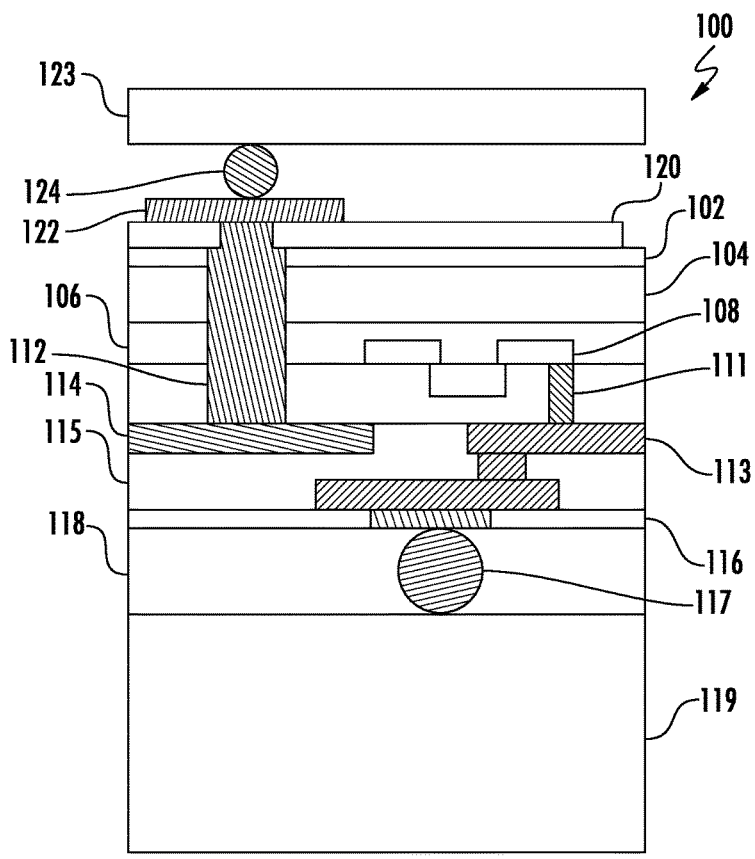
Figure 18:
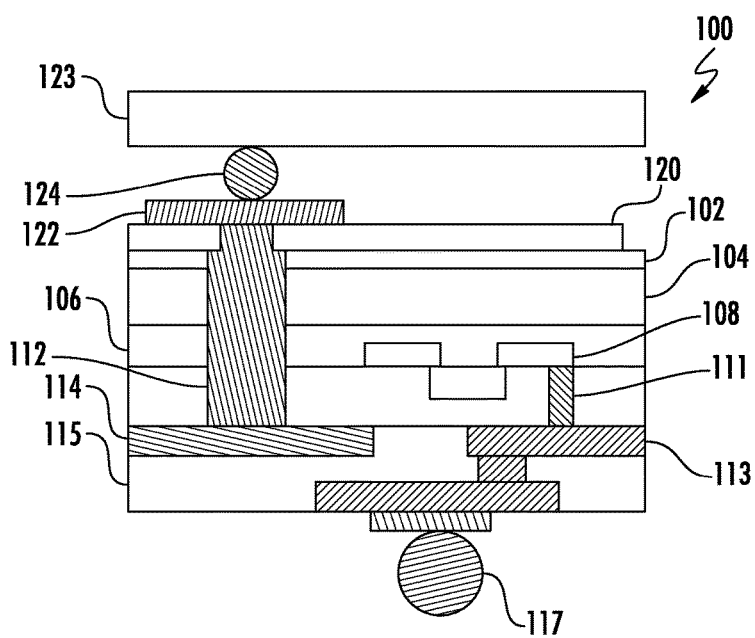
Figure 19:
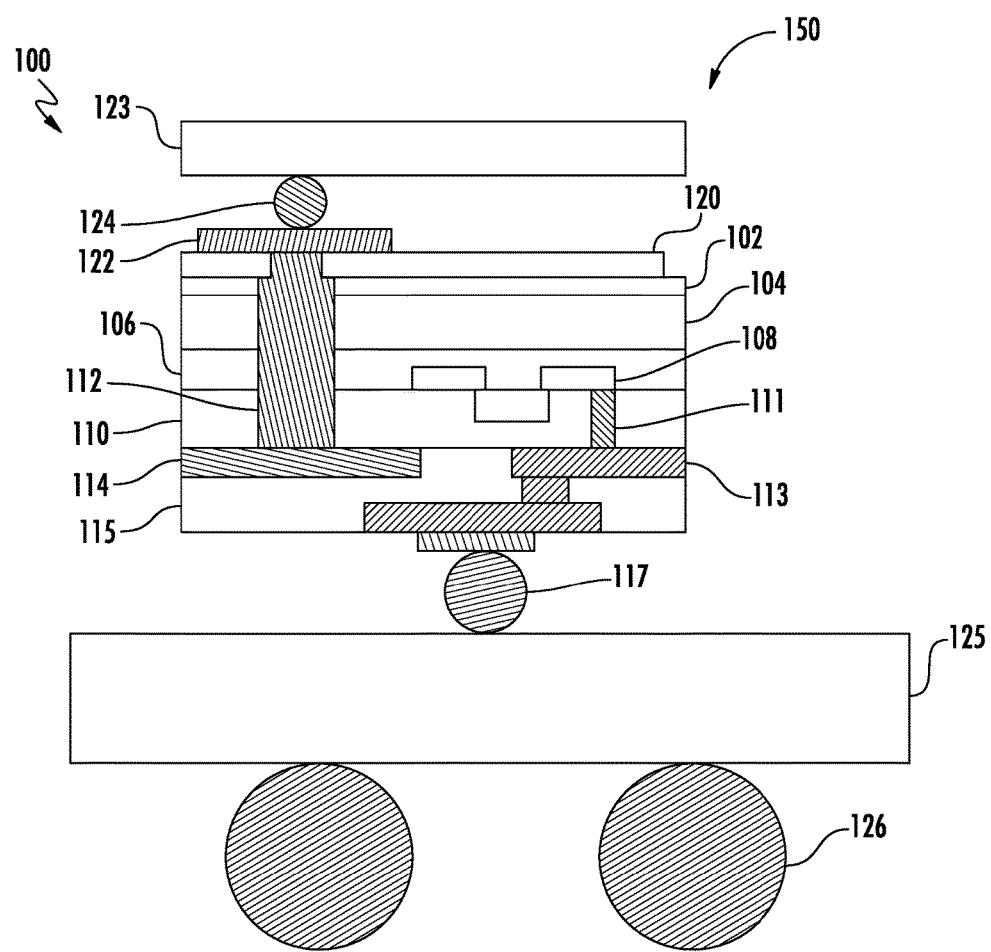

Assembly and test operations may then be formed, including coupling the UBM pad 122 to a chip 123 with a conductive UBM "micro" bump 124 (FIG. 17). The carrier 119 may then be de-bonded and the adhesive layer 118 removed (FIG. 18), followed by dicing and coupling of the bump 117 to a package substrate 125 having conductive bumps or contacts 126 to form the final device 150 (FIG. 19). Testing may then be performed as desired.

Many modifications and other embodiments will come to the mind of one skilled in the art having the benefit of the teachings presented herein. Therefore, it is understood that the disclosure is not to be limited to the specific exemplary embodiments disclosed herein.

That which is claimed is:

1. A semiconductor processing method comprising:
    forming a superlattice gettering layer on a front side of a semiconductor substrate having a first thickness, the superlattice gettering layer comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
    epitaxially growing an active semiconductor layer on the superlattice gettering layer opposite the semiconductor substrate;
    forming at least one semiconductor device in the active semiconductor layer;
    forming at least one metal interconnect layer on the active layer, and at least one metal through-via extending from the at least one metal interconnect layer into the semiconductor substrate; and
    thinning the semiconductor substrate from a back side thereof to a second thickness less than the first thickness;
    the superlattice gettering layer configured to getter metal ions released by the forming of the at least one metal interconnect layer and at least one metal through-via, and thinning the semiconductor substrate.

2. The method of claim 1 wherein the second thickness is less than 200 µm.

3. The method of claim 1 wherein the second thickness is less than 70 µm.

4. The method of claim 1 wherein the active semiconductor layer has a thickness in a range of 2 to 5 µm.

5. The method of claim 1 wherein a metal of the at least one metal interconnect comprises copper.

6. The method of claim 1 wherein each base semiconductor portion comprises silicon.

7. The method of claim 1 wherein the at least one non-semiconductor layer comprises oxygen.

8. The method of claim 1 wherein epitaxially growing the active semiconductor layer comprises epitaxially growing a silicon layer.

9. The method of claim 1 wherein forming the at least one semiconductor device comprises forming at least one field effect transistor (FET) in the active semiconductor layer.

10. A semiconductor processing method comprising:
    forming a superlattice gettering layer on a front side of a semiconductor substrate having a first thickness, the superlattice gettering layer comprising a plurality of stacked groups of layers, each group of layers comprising a plurality of stacked base silicon monolayers defining a base silicon portion, and at least one oxygen monolayer constrained within a crystal lattice of adjacent base silicon portions;
    epitaxially growing an active semiconductor layer on the superlattice gettering layer opposite the semiconductor substrate;
    forming at least one semiconductor device in the active semiconductor layer;
    forming at least one metal interconnect layer on the active layer, and at least one metal through-via extending from the at least one metal interconnect layer into the semiconductor substrate; and thinning the semiconductor substrate from a back side thereof to a second thickness less than the first thickness;

the superlattice gettering layer configured to getter metal ions released by the forming of the at least one metal interconnect layer and at least one metal through-via, and thinning the semiconductor substrate.

11. The method of claim 10 wherein the second thickness is less than 200 µm.

12. The method of claim 10 wherein the second thickness is less than 70 µm.

13. The method of claim 10 wherein the active semiconductor layer has a thickness in a range of 2 to 5 µm.

14. The method of claim 10 wherein a metal of the at least one metal interconnect comprises copper.

15. The method of claim 10 wherein epitaxially growing the active semiconductor layer comprises epitaxially growing a silicon layer.

16. The method of claim 10 wherein forming the at least one semiconductor device comprises forming at least one field effect transistor (FET) in the active semiconductor layer.

17. A semiconductor processing method comprising:

forming a superlattice gettering layer on a front side of a semiconductor substrate having a first thickness, the superlattice gettering layer comprising a plurality of stacked groups of layers, each group of layers comprising a plurality of stacked base silicon monolayers defining a base silicon portion, and at least one oxygen monolayer constrained within a crystal lattice of adjacent base silicon portions;

epitaxially growing an active semiconductor layer on the superlattice gettering layer opposite the semiconductor substrate, the active semiconductor layer having a thickness in a range of 2 to 5 µm;

forming at least one semiconductor device in the active semiconductor layer;

forming at least one metal interconnect layer on the active layer, and at least one metal through-via extending from the at least one metal interconnect layer into the semiconductor substrate; and thinning the semiconductor substrate from a back side thereof to a second thickness less than the first thickness, the second thickness being less than 200 µm;

the superlattice gettering layer configured to getter metal ions released by the forming of the at least one metal interconnect layer and at least one metal through-via, and thinning the semiconductor substrate.

18. The method of claim 17 wherein the second thickness is less than 70 µm.

19. The method of claim 17 wherein epitaxially growing the active semiconductor layer comprises epitaxially growing a silicon layer.

20. The method of claim 17 wherein forming the at least one semiconductor device comprises forming at least one field effect transistor (FET) in the active semiconductor layer.

* * * * *